US006392860B1

United States Patent
Lin et al.

(10) Patent No.: US 6,392,860 B1
(45) Date of Patent: May 21, 2002

(54) ELECTROSTATIC DISCHARGE PROTECTION CIRCUIT WITH GATE-MODULATED FIELD-OXIDE DEVICE

(75) Inventors: Geeng-Lih Lin; Ming-Dou Ker, both of Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/474,999

(22) Filed: Dec. 30, 1999

(51) Int. Cl.[7] .................................. H02H 3/22
(52) U.S. Cl. ...................... 361/111; 361/56; 257/360
(58) Field of Search ....................... 361/56, 58, 91, 361/111, 117–119, 127; 257/360, 408, 506; 438/400, 439; 327/310, 313, 318, 327, 328, 534

(56) References Cited

U.S. PATENT DOCUMENTS 5,686,751 A * 11/1997 Wu ........................... 257/360
5,895,959 A * 4/1999 Chang ....................... 257/360
5,985,722 A * 11/1999 Kishi ........................ 438/275
5,998,832 A * 12/1999 Sheu et al. ................. 257/327
6,163,056 A * 12/2000 Maekawa ................... 257/360
6,177,324 B1 * 1/2001 Song et al. ................. 257/360

* cited by examiner

Primary Examiner—Michael J. Sherry
(74) Attorney, Agent, or Firm—J. C. Patents

(57) ABSTRACT

An ESD (electrostatic discharge) protection circuit employs a field oxide region between the drain region and the source region to break a surface channel between the drain region and the source region. As a result, the whole ESD current is discharged via the substrate to the ground by using a gate-modulated field-oxide device, and the potential endurance of ESD device can be improved. Additionally, the invention utilizes circuit technology to detect an ESD signal so that the response speed can be increased. Furthermore, the invention can maintain a deep current path due to the gate-modulated field-oxide device for improving its ESD robustness and decreasing the device size effectively and achieving a better ESD protection efficiency.

22 Claims, 4 Drawing Sheets

ELECTROSTATIC DISCHARGE PROTECTION CIRCUIT WITH GATE-MODULATED FIELD-OXIDE DEVICE

BACKGROUND OF THE INVENTION

1. The Field of the Invention

The present invention relates to an electrostatic discharge (ESD) protection circuit. More particularly, the present invention relates to an ESD protection circuit, which can improve the response speed by detecting an ESD signal with a circuit technique, and can maintain the deep current path by using a gate-modulated field-oxide device, so that this design can effectively improve ESD robustness.

2. Description of the Related Art

Electrostatic discharge (ESD) can easily damage IC devices such as DRAMs and SRAMs during both manufacture and operation. A person walking on a carpet, for instance, can carry up to several thousand volts of electrostatic charge under high relative humidity (RH) conditions and over 10,000 volts under low RH conditions. If such a person touches an IC package, the electrostatic charge on his/her body is instantly discharged to the IC package, thus causing ESD damage to the internal circuitry of the IC package. A widely used solution to this problem is to provide an on-chip ESD protection circuit around each I/O pad of the IC package.

One drawback to the prior art, however, is that when the IC device is fabricated by scaled down technology, such as the deep-submicron CMOS process, the gate-oxide structure is reduced in thickness. This causes the breakdown voltage of the gate-oxide structure to be close to or below the breakdown voltage at the source/drain junction, thus degrading the ESD protection capability. The internal circuitry of an IC device is typically drawn in accordance with the Minimum Design Rules. Therefore, the various semiconductor components of an IC device are designed to have the minimum size. This practice, however, makes some components vulnerable to ESD stress, when these components are further scaled down. For this reason, a highly-integrated IC device fabricated at the deep-submicron process is particularly vulnerable to ESD. Therefore, in the IC industry, much research effort has been directed to ESD protection for integrated circuitry.

FIG. 1A is a circuit diagram for a conventional ESD protection circuit. As shown in FIG. 1A, in order to protect the internal circuit 10, the ESD current imported through an input port INP is discharged through an NMOS transistor 12 to a ground $V_{SS}$. FIG. 1B is a schematic circuit diagram of another conventional ESD protection circuit. As shown in FIG. 1B, in order to protect the internal circuit 18, the ESD current can be discharged not only through an NMOS transistor 14 to the ground $V_{SS}$ but also through a PMOS transistor 16 to a voltage source $V_{dd}$.

The conventional ESD protection circuits as described above and shown in FIGS. 1A and 1B both utilize junction breakdown voltage to protect an internal circuit from damage. However, when the IC device is fabricated at a scaled down CMOS process and the gate-oxide structure is accordingly reduced in thickness, some problems arise; for example, the breakdown voltage of the gate-oxide structure happens earlier than the junction breakdown voltage at the source/drain junction. In other words, if the breakdown voltage of the gate-oxide structure happens earlier than the junction breakdown voltage at the source/drain junction, then the conventional ESD protection circuits as shown in FIGS. 1A and 1B lose their protection ability.

FIG. 2 is a circuit diagram for another conventional ESD protection circuit. As shown in FIG. 2, the ESD protection circuit 20 comprises NMOS transistors 22 and 24, a PMOS transistor 26, a resistor (R) 28 and a capacitor (C) 30. In NMOS transistor 22, the drain is coupled to a voltage source $V_{dd}$, the source is coupled to ground $V_{SS}$, and the gate is coupled to a first node B. In NMOS transistor 24, the drain is coupled to the first node B, the source is coupled to the ground $V_{SS}$, and the gate is coupled to a second node A. In PMOS transistor 26, the source is coupled to the voltage source $V_{dd}$, the drain is coupled to the first node B, and the gate is coupled to the second node A. The resistor 28 is connected between the voltage source $V_{dd}$ and the second node A, while the capacitor 30 is connected between the second node A and the ground $V_{SS}$.

The operation method for the conventional ESD protection circuit 20 as shown in FIG. 2 is described as follows. For example, a situation of positive ESD stress is considered. When the positive ESD stress occurs, because of the resistor-capacitor delay (RC delay), i.e. the ESD stress on the voltage source $V_{dd}$ increases rapidly and is faster than the RC time constant, and the voltage on the node A increases very slowly corresponding to the voltage source $V_{dd}$, the node A is not yet established in the positive potential. As a result, PMOS transistor 26 is turned on. Meanwhile the ESD current can be drained from PMOS transistor 26 to the gate of NMOS transistor 22, so that NMOS transistor 22 can be turned on early and the ESD current is discharged through the NMOS transistor 22 to ground $V_{SS}$. In spite of the protection of NMOS transistor 24, such design requires a device with larger dimensions and size. In addition, the relative applications can refer to U.S. Pat. No. 5,744,842.

SUMMARY OF THE INVENTION

The invention provides an electrostatic discharge protection circuit. The electrostatic discharge protection circuit comprises a gate-modulated field-oxide device, an NMOS transistor, a PMOS transistor, a resistor and a capacitor. In the gate-modulated field-oxide device, the drain is coupled to a voltage source, the source is coupled to ground, and the gate is coupled to a first node. In the NMOS transistor, the drain is coupled to the first node, the source is coupled to the ground, and the gate is coupled to a second node. In the PMOS transistor, the source is coupled to the voltage source, the drain is coupled to the first node, and the gate is coupled to the second node. The resistor is connected between the voltage source and the second node and the capacitor is connected between the second node and the ground. Additionally, the gate of the gate-modulated field-oxide device is further connected to the substrate so as to raise the substrate voltage.

Additionally, the invention provides an electrostatic discharge protection circuit, which comprises a gate-modulated field-oxide device, an NMOS transistor, a PMOS transistor, a resistor and a capacitor. In the gate-modulated field-oxide device, the drain is coupled to a voltage source, the source and the gate are coupled to the ground, and the substrate is coupled to a first node. In the NMOS transistor, the drain is coupled to the first node, the source is coupled to the ground, and the gate is coupled to a second node. In the PMOS transistor, the source is coupled to the voltage source, the drain is coupled to the first node, and the gate is coupled to the second node. The resistor is connected between the voltage source and the second node and the capacitor is connected between the second node and the ground.

The gate-modulated field-oxide device according to the present invention is formed on a substrate and comprises: an isolation structure formed in the substrate, a gate electrode formed over the isolation structure and isolated from the substrate by a gate oxide layer, a drain region in the substrate at one side of the gate electrode, a source region in the substrate at the other side of the gate electrode, a deep N-well region in the bottom of the substrate and an n-well region which is formed in the substrate between the source region and the deep N-well region.

To achieve these and other advantages and in accordance with the purpose of the invention, as embodied and broadly described herein, the invention provides an electrostatic discharge protection circuit, which forms a field-oxide region between the drain region and the source region. The surface channel between the drain region and the source region is broken because of the field-oxide region, so the whole ESD current is then discharged via the substrate to the ground by using the gate-modulated field-oxide device of the present invention, and the potential endurance of ESD device can be improved. Additionally, the present invention utilizes circuit technology to detect an ESD signal so that the response speed can be increased. Furthermore, the present invention can maintain a deep current path due to the gate-modulated field-oxide device, therefore the device size used for ESD protection can be reasonably reduced. Moreover, the present invention also can be used with input or output pad protection circuits, so that the dimension and size of a device can be decreased and the input or output capacitor of a device can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
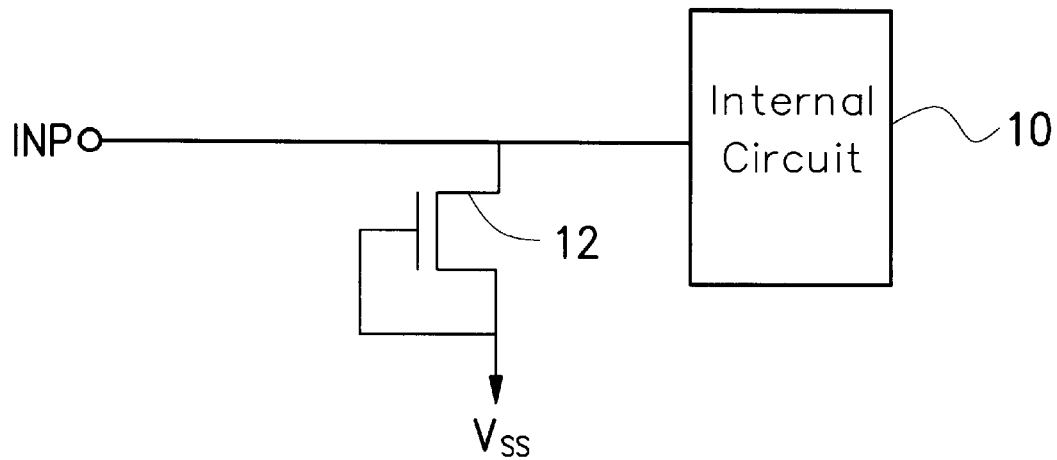
FIG. 1A is a circuit diagram for a conventional ESD protection circuit.
Figure 1B:
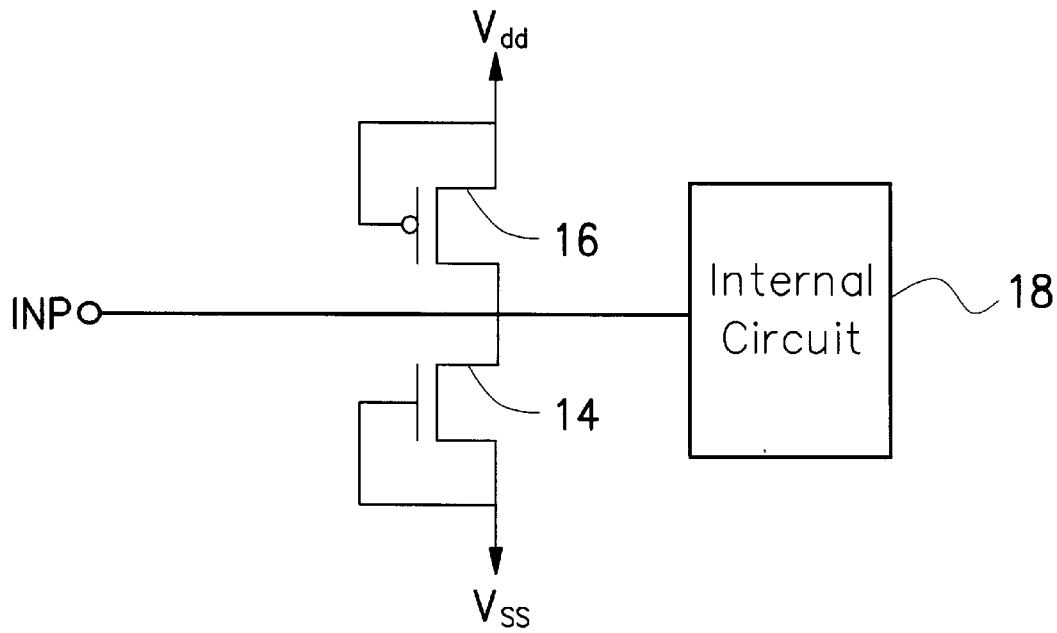
FIG. 1B is a circuit diagram for another conventional ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
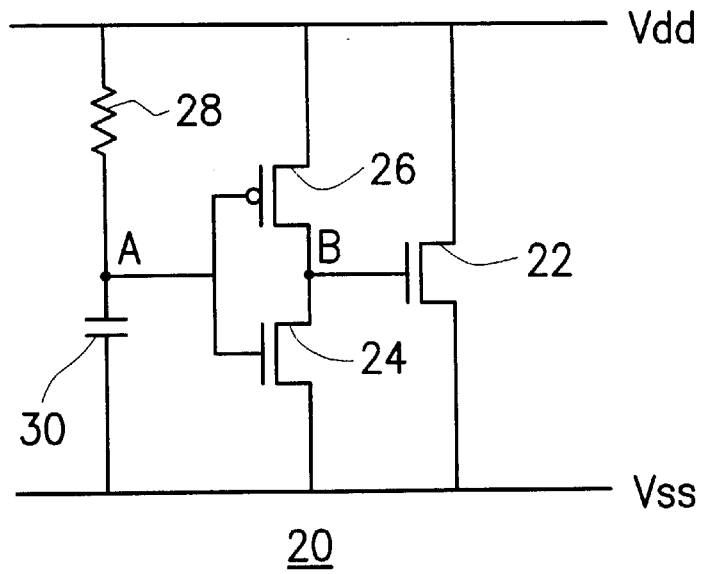
FIG. 2 is a circuit diagram for another conventional ESD protection circuit.
Figure 3A:
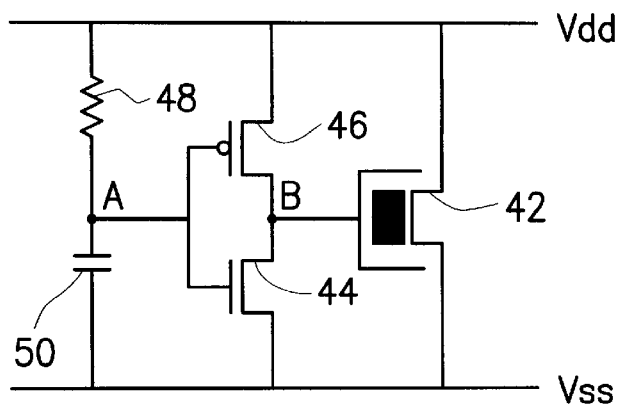
FIG. 3A is a circuit diagram of an ESD protection circuit according to the first preferred embodiment of the present invention.
Figure 3B:
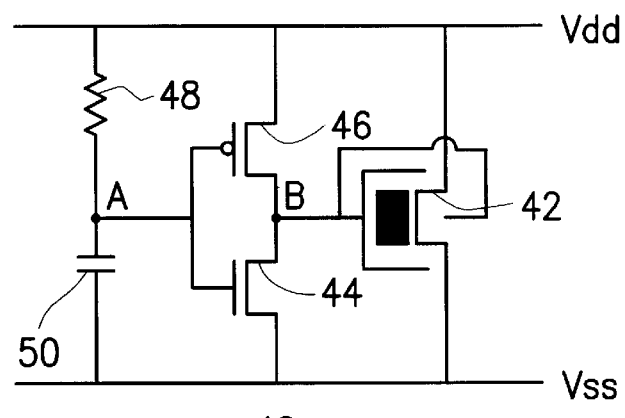
FIG. 3B is a circuit diagram of an ESD protection circuit according to the second preferred embodiment of the present invention.
Figure 3C:
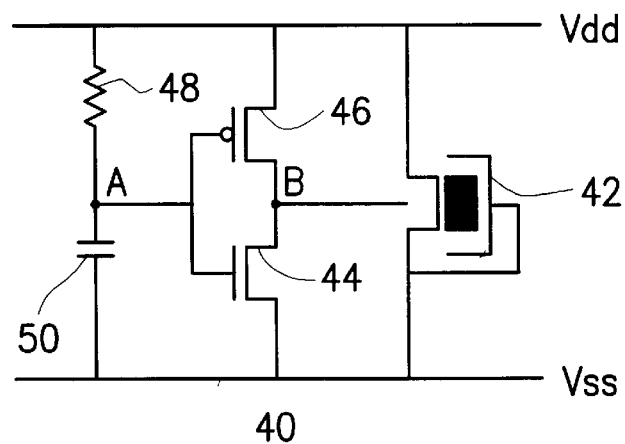
FIG. 3C is a circuit diagram of an ESD protection circuit according to the third preferred embodiment of the present invention.

FIGS. 3A, 3B and 3C are the circuit diagrams of ESD protection circuits according to the first, second and third preferred embodiment of the present invention, respectively. In these embodiments, the ESD protection circuits provided by the invention are similar to the conventional circuit shown in FIG. 2. However, internal structure of the ESD protection circuit provided by the invention is different from that of the conventional ESD protection circuit, that is, NMOS transistor 22 of the conventional ESD protection circuit (as shown in FIG. 2) is replaced by a gate-modulated field-oxide device of the invention (as shown in FIGS. 3A, 3B and 3C), so that the ESD device dimension and size can be reduced effectively.

Referring to FIG. 3A, an electrostatic discharge protection circuit 40 of the invention comprises a gate-modulated field-oxide device 42, an NMOS transistor 44, a PMOS transistor 46, a resistor (R) 48 and a capacitor (C) 50. In the gate-modulated field-oxide device 42, the drain is coupled to a voltage source $V_{dd}$, the source is coupled to ground $V_{SS}$, and the gate is coupled to a first node B. In the NMOS transistor 44, the drain is coupled to the first node B, the source is coupled to the ground $V_{SS}$, and the gate is coupled to a second node A. In the PMOS transistor 46, the source is coupled to the voltage source $V_{dd}$, the drain is coupled to the first node B, and the gate is coupled to the second node A. Resistor 48 connected between the voltage source $V_{dd}$ and the second node A and the capacitor 50 is connected between the second node A and the ground $V_{SS}$.

Figure 4:
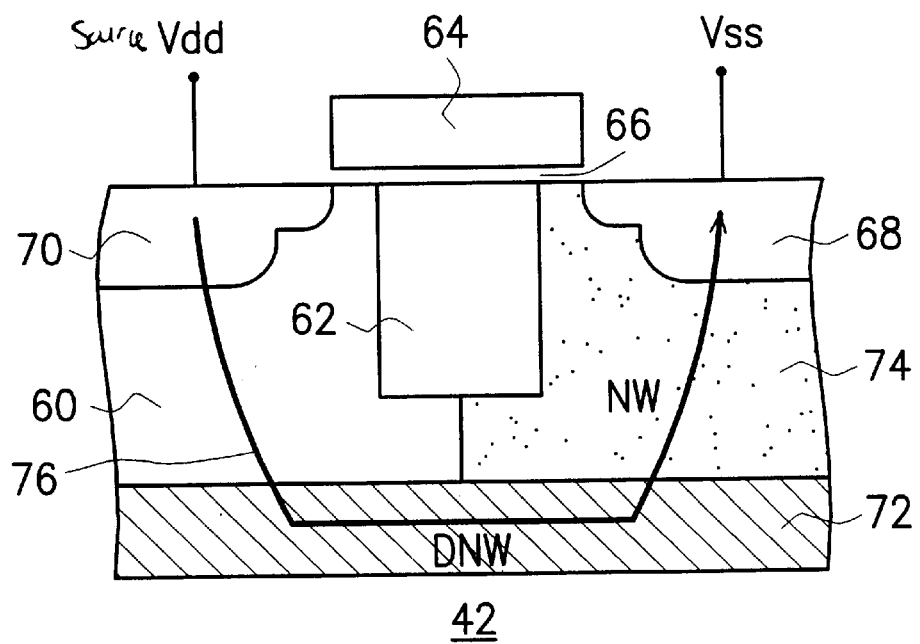
FIG. 4 is a schematic, cross-sectional view of a gate-modulated field-oxide device in FIG. 3 according to the invention.

FIG. 4 is a schematic, cross-sectional view of a gate-modulated field-oxide device 42 in FIG. 3 according to the invention.

The gate-modulated field-oxide device 42 according to the present invention is formed on a substrate 60. The structure of the gate-modulated field-oxide device 42 comprises an isolation structure 62 such as a Shallow Trench Isolation (STI) structure, which is formed in the substrate 60. The method for forming the isolation structure 62 includes Local Oxidation of Silicon (LOCOS) or STI techniques. A gate electrode 64 is formed over the isolation structure 62 and is isolated from the substrate 60 by a gate oxide layer 66. A source region 68 is located in the substrate 60 on one side of the gate electrode 64. A drain region 70 is located in the substrate 60 on the other side of the gate electrode 64. The source and drain region 68 and 70 both have a Lightly Doped Drain (LDD) structure. A deep N-well (DNW) region 72 is located in the bottom of the substrate 60 and an n-well (NW) region 74 is formed in the substrate 60 between the source region 68 and the deep N-well region 72.

Referring to FIGS. 3A and 4, the operation method for the ESD protection circuit 40 is described as follows. For example, a situation of a positive ESD stress happens. Because of the resistor-capacitor delay (RC delay), the ESD stress on the voltage source $V_{dd}$ increases rapidly which is faster than the RC time constant, and the voltage on the node A increases very slowly in correspondence to the voltage source $V_{dd}$. At this point, the node A has not been established in the positive potential, so PMOS transistor 46 is turned on. Meanwhile, the ESD current can be drained from PMOS transistor 46 to the gate of the gate-modulated field-oxide device 42, so that the gate-modulated field-oxide device 42 can be turned on early and the ESD current is discharged through the gate-modulated field-oxide device 42 to ground $V_{SS}$.

It has been noted that when the gate-modulated field-oxide device 42 is switched on, the ESD current entering from the drain region 70 is discharged via substrate 60, deep N-well region 72, N-well region 74 and source region 68 to ground $V_{SS}$, as shown by the discharge current path 76 in FIG. 4. That is, the invention forms a field oxide region between the drain region 70 and the source region 68 and the surface channel between the drain region 70 and the source region 68 is broken because of the field oxide region, so that the whole ESD current is discharged via the substrate 60 to ground $V_{SS}$ by the gate-modulated field-oxide device 42, and the potential endurance of the ESD device can be improved.

Figure 5A:
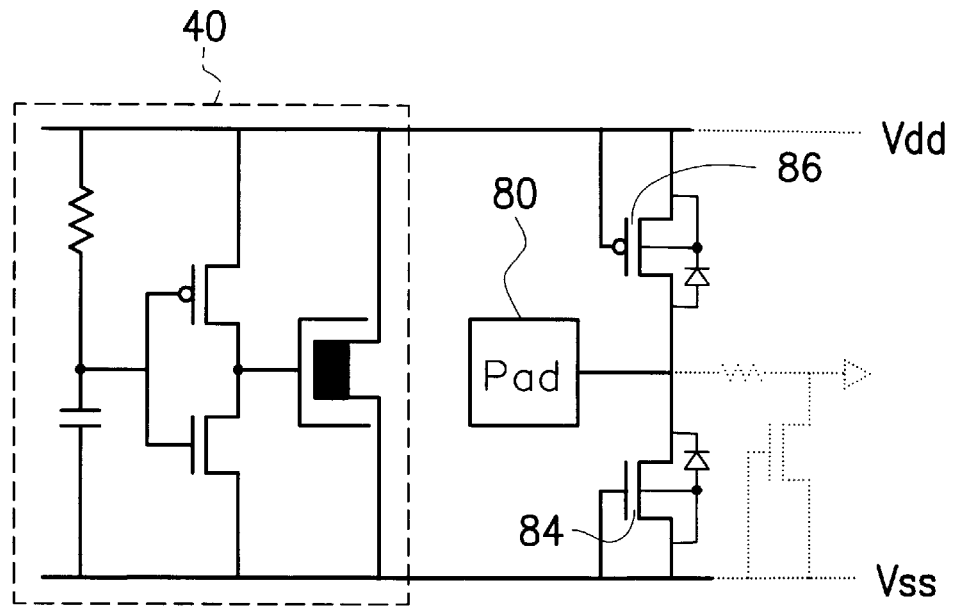
FIGS. 5A and 5B are circuit diagrams of ESD protection circuits of the invention used with input pad and output pad protection circuits, respectively.
Figure 5B:
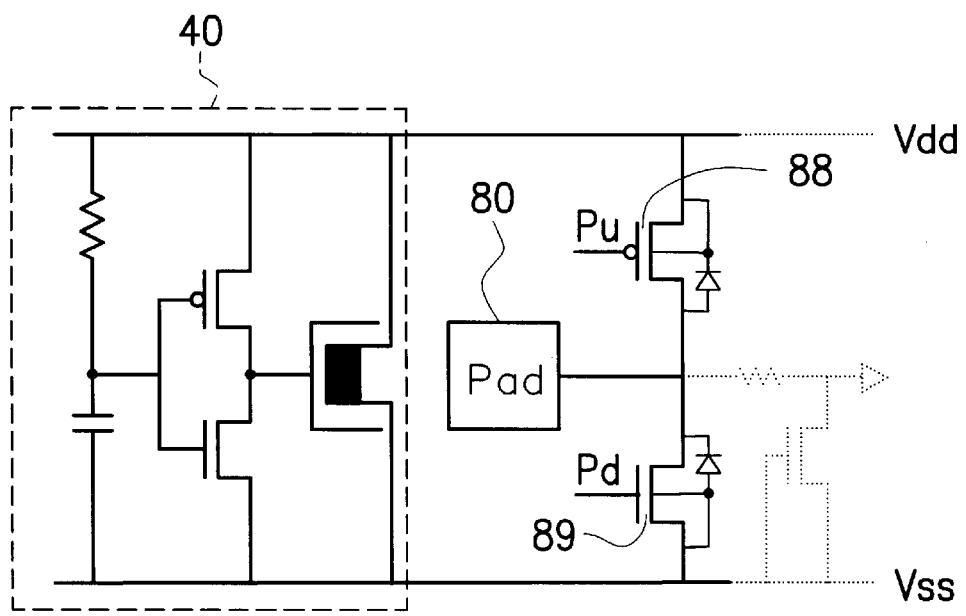

Thus, the present invention uses circuit technology to detect an ESD signal so that the response speed can be increased. Additionally, the invention can maintain a deep current path by using a specific protection device (i.e. the gate-modulated field-oxide device 42) for improving the ESD robustness and decreasing the device size effectively. Furthermore, the invention also can be used with input or output pad protection circuits as shown in FIGS. 5A and 5B. In FIG. 5A, when a positive ESD voltage reaches to the pad 80, the ESD current is conducted to the $V_{dd}$ power line through the drain junction diode of PMOS 86. The ESD current is then discharged from $V_{dd}$ to $V_{SS}$ through the $V_{dd}$- to $-V_{SS}$ ESD clamp circuit 40. Finally, the ESD current is conducted to the grounded $V_{SS}$. In this stress condition, the positive ESD voltage zapped at the pad 80 with respect to the $V_{SS}$ grounded, the NMOS 84 of input ESD protection circuit is not over biased to cause junction breakdown on itself. Therefore, the dimension and size of the input ESD protection circuit can be reduced to reduce the input capacitance on the pad 80.

On the other hand, when a negative ESD stress reaches to the input pad 80 with respect to the grounded $V_{dd}$, the negative ESD voltage is conducted to the $V_{SS}$ line through the drain junction diode of the NMOS 84 in the input ESD protection circuit of FIG. 5A. The negative ESD voltage is discharged from $V_{SS}$ to $V_{dd}$ line through the $V_{dd}$- to $-V_{SS}$ ESD clamp circuit 40. Finally, the negative ESD current is conducted to the grounded $V_{dd}$. In this negative ESD stress, the PMOS 86 is not over biased to cause drain junction breakdown on itself. Therefore, the device dimension of PMOS 86 can be reduced to reduce the parasitic junction capacitance on the pad 80. With a much small input capacitance on the pad 80, it is more suitable for high-frequency or high-speed applications.

In FIG. 5B, the ESD discharging current paths during the positive or negative ESD stress are the same as those in FIG. 5A. So, the ESD robustness of the output buffer (Pu 88 and Pd 89) can be effectively improved by adding the $V_{dd}$- to $-V_{SS}$ ESD clamp circuit 40 into the output circuit.

Additionally, it has been noted that the ESD protection circuit 40 in FIG. 3A of the invention can be replaced by the ESD protection circuit 40 in FIGS. 3B and 3C. Because the structure and connection of the ESD protection circuit 40 shown in FIGS. 3B and 3C are similar to those in FIG. 3A, they is not described again. The major difference between FIG. 3B and FIG. 3A is that the gate of the gate-modulated field-oxide device 42 in FIG. 3B is also connected to its substrate. Furthermore, the greatest difference between FIG. 3C and 3A is that the gate of the gate-modulated field-oxide device 42 in FIG. 3C is connected to its source (which is connected to ground $V_{SS}$) and its substrate is connected to the node B.

The operation method for the ESD protection circuit 40 in FIGS. 3B and 3C is the same as described above with reference to FIG. 3A. The greatest operational difference is that the substrate voltage of the gate-modulated field-oxide device 42 in FIGS. 3B and 3C is enhanced because their substrates are connected to the node B; thus, the trigger voltage of the gate-modulated field-oxide device 42 will be lower than that in the previous embodiment (as shown in FIG. 3A), that is, the gate-modulated field-oxide device 42 in FIGS. 3B and 3C with a substrate bias have a lower trigger voltage for achieving a better ESD protection efficiency.

Accordingly, the invention has the following advantages:
(1) By forming a field oxide region between the drain region and the source region, the surface channel between the drain region and the source region is broken, so that the whole ESD current is discharged via the substrate to the ground by using the gate-modulated field-oxide device of the present invention, and the potential endurance of ESD device can be improved.
(2) Circuit technology is used to detect an ESD signal so that the response speed can be increased. The present invention can maintain a deep current path due to the gate-modulated field-oxide device for improving its ESD robustness and decrease the device size effectively.
(3) The invention also can be merged with input or output ESD protection circuits, so that the dimension and size of devices in the input or output ESD protection circuits can be decreased and the input or output capacitor on the pad can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection circuit, comprising:
   an NMOS transistor, of which the drain is coupled to a first node, a source is coupled to a ground, and a gate of which is coupled to a second node;
   a PMOS transistor, of which a source is coupled to a voltage source, a drain is coupled to the first node, and a gate is coupled to the second node;
   a resistor connected between the voltage source and the second node;
   a capacitor connected between the second node and the ground; and
   a gate-modulated field oxide device formed on a substrate, comprising:
      an isolation structure in the substrate;
      a gate-electrode formed over the isolation structure, isolated from the substrate by a gate-oxide layer, and coupled to the first node;
      a drain region in the substrate coupled to the voltage source;
      a source region in the substrate coupled to the ground;
      a deep N-well region in a bottom of the substrate; and
      an n-well region which is formed in the substrate between the source region and the deep N-well region.

2. The electrostatic discharge protection circuit of claim 1, wherein the isolation structure is a shallow trench isolation structure.

3. The electrostatic discharge protection circuit of claim 1, wherein the the isolation structure is formed using a LOCOS technique.

4. The electrostatic discharge protection circuit of claim 1, wherein the isolation structure is formed using a STI technique.

5. The electrostatic discharge protection circuit of claim 1, wherein the drain region and the source region of the gate-modulated field oxide device both have a Lightly Doped Drain (LDD) structure.

6. The electrostatic discharge protection circuit of claim 1, wherein the gate of the specific field oxide device is further connected to the substrate so as to raise the substrate voltage.

7. An electrostatic discharge protection circuit, comprising:
   an NMOS transistor, of which a drain transistor is coupled to a first node, a source is coupled to a ground, and a gate is coupled to a second node;
   a PMOS transistor, of which source a is coupled to a voltage source, a drain is coupled to the first node, and a gate is coupled to the second node;
   a resistor connected between the voltage source and the second node;
   a capacitor connected between the second node and the ground; and
   a gate-modulated field oxide device comprising:
      a substrate coupled to the first node;
      an isolation structure in the substrate;
      a gate electrode formed over the isolation structure, isolated from the substrate by a gate oxide layer, and coupled to the ground;
      a drain region in the substrate coupled to a voltage source;
      a source region in the substrate coupled to the ground;
      a deep N-well region in a bottom of the substrate; and
      an n-well region which is formed in the substrate between the source region and the deep N-well region.

8. The electrostatic discharge protection circuit of claim 7, wherein the isolation structure is a shallow trench isolation structure.

9. The electrostatic discharge protection circuit of claim 7, wherein the isolation structure is formed using a LOCOS technique.

10. The electrostatic discharge protection circuit of claim 7, wherein the isolation structure is formed using a STI technique.

11. The electrostatic discharge protection circuit of claim 7, wherein the drain region and the source region of the gate-modulated field oxide device both have a Lightly Doped Drain (LDD) structure.

12. An electrostatic discharge protection circuit, comprising:
   an ESD clamp circuit, comprising:
      a first NMOS transistor, of which the drain is coupled to a first node, a source is coupled to a ground, and a gate of which is coupled to a second node;
      a first PMOS transistor, of which a source is coupled to a voltage source, a drain is coupled to the first node, and a gate is coupled to the second node;
      a resistor connected between the voltage source and the second node;
      a capacitor connected between the second node and the ground;
   a pad;
   a second NMOS transistor, of which the drain is coupled to the pad, and a gate and a source of which are coupled to the ground;
   a second PMOS transistor, of which a drain is coupled to the pad, a gate and a source of which are coupled to the voltage source; and
   a gate-modulated field oxide device comprising:
      a substrate coupled to the first node;
      an isolation structure in the substrate;
      a gate electrode formed over the isolation structure, isolated from the substrate by a gate oxide layer, and coupled to the ground;
      a drain region in the substrate coupled to the voltage source;
      a source region in the substrate coupled to the ground;
      a deep N-well region in a bottom of the substrate; and
      an n-well region which is formed in the substrate between the source region and the deep N-well region.

13. The electrostatic discharge protection circuit of claim 12, wherein the isolation structure is a shallow trench isolation structure.

14. The electrostatic discharge protection circuit of claim 12, wherein the gate of the specific field oxide device is further connected to the substrate so as to raise the substrate voltage.

15. An electrostatic discharge protection circuit, comprising:
   an ESD clamp circuit, comprising:
      a first NMOS transistor, of which the drain is coupled to a first node, a source is coupled to a ground, and a gate of which is coupled to a second node;
      a first PMOS transistor, of which a source is coupled to a voltage source, a drain is coupled to the first node, and a gate is coupled to the second node;
      a resistor connected between the voltage source and the second node; and
      a capacitor connected between the second node and the ground;
   a pad;
   a second NMOS transistor, of which the drain is coupled to the pad, a source is coupled to the ground;
   a second PMOS transistor, of which a source is coupled to the voltage source, a drain is coupled to the pad; and
   a gate-modulated field oxide device comprising:
      a substrate coupled to the first node;
      an isolation structure in the substrate;
      a gate electrode formed over the isolation structure, isolated from the substrate by a gate oxide layer, and coupled to the ground;
      a drain region in the substrate coupled to the voltage source;
      a source region in the substrate coupled to the ground;
      a deep N-well region in a bottom of the substrate; and
      an n-well region which is formed in the substrate between the source region and the deep N-well region.

16. The electrostatic discharge protection circuit of claim 15, wherein the isolation structure is a shallow trench isolation structure.

17. The electrostatic discharge protection circuit of claim 15, wherein the gate of the specific field oxide device is further connected to the substrate so as to raise the substrate voltage.

18. An electrostatic discharge protection circuit, comprising:
   an NMOS transistor, of which a drain transistor is coupled to a first node, a source is coupled to a ground, and a gate is coupled to a second node;

a PMOS transistor, of which source a is coupled to a voltage source, a drain is coupled to the first node, and a gate is coupled to the second node;

a resistor connected between the voltage source and the second node;

a capacitor connected between the second node and the ground; and a gate-modulated field oxide device comprising:
   a substrate coupled to the first node;
   an isolation structure in the substrate;
   a gate electrode formed over the isolation structure, isolated from the substrate by a gate oxide layer, and coupled to the first node;
   a drain region in the substrate coupled to the voltage source;
   a source region in the substrate coupled to the ground;
   a deep N-well region in a bottom of the substrate; and
   an n-well region which is formed in the substrate between the source region and the deep N-well region.

19. The electrostatic discharge protection circuit of claim 18, wherein the isolation structure is a shallow trench isolation structure.

20. The electrostatic discharge protection circuit of claim 18, wherein the the isolation structure is formed using a LOCOS technique.

21. The electrostatic discharge protection circuit of claim 18, wherein the isolation structure is formed using a STI technique.

22. The electrostatic discharge protection circuit of claim 18, wherein the drain region and the source region both have a Lightly Doped Drain (LDD) structure.

* * * * *